(12) United States Patent
Wu et al.

(10) Patent No.: US 11,963,336 B2
(45) Date of Patent: *Apr. 16, 2024

(54) FILM-LIKE HEAT DISSIPATION MEMBER, BENDABLE DISPLAY APPARATUS, AND TERMINAL DEVICE

(71) Applicant: HUAWEI TECHNOLOGIES CO., LTD., Guangdong (CN)

(72) Inventors: Huipeng Wu, Dongguan (CN); Quanming Li, Dongguan (CN); Guo Yang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/859,034

(22) Filed: Jul. 7, 2022

(65) Prior Publication Data

US 2022/0338381 A1  Oct. 20, 2022

Related U.S. Application Data

(63) Continuation of application No. 16/851,337, filed on Apr. 17, 2020, now Pat. No. 11,406,044, which is a (Continued)

(30) Foreign Application Priority Data

Oct. 20, 2017  (CN) .......................... 201710983771.0

(51) Int. Cl.
*H05K 7/20* (2006.01)
*F28F 3/02* (2006.01)
*G09F 9/30* (2006.01)

(52) U.S. Cl.
CPC .......... *H05K 7/20481* (2013.01); *F28F 3/02* (2013.01); *G09F 9/301* (2013.01); *H05K 7/20963* (2013.01)

(58) Field of Classification Search
CPC ... H05K 7/20481; H05K 7/20963; F28F 3/02; G09F 9/301
(Continued)

(56) References Cited

U.S. PATENT DOCUMENTS 5,990,618 A   11/1999   Morita et al.
5,992,155 A   11/1999   Kobayashi et al.
(Continued)

FOREIGN PATENT DOCUMENTS

CN   1161621 A    10/1997
CN   2762508 Y    3/2006
(Continued)

OTHER PUBLICATIONS

Office Action issued in KR 10-2020-7014002 dated Sep. 27, 2021, 18 pages.

*Primary Examiner* — Anatoly Vortman

(57) ABSTRACT

This application provides a film-like heat dissipation member, a bendable display apparatus, and a terminal device. The film-like heat dissipation member includes a heat dissipation layer. Composition and a structure of the heat dissipation layer are designed, so that a cutting-plane length of the heat dissipation layer changes in a surface bending process, can be bent repeatedly, and can implement uniform temperatures on two sides of the bendable display apparatus and the terminal device, thereby improving heat dissipation capabilities of the bendable display apparatus and the terminal device.

17 Claims, 21 Drawing Sheets

Related U.S. Application Data continuation of application No. PCT/CN2018/093582, filed on Jun. 29, 2018.

(58) Field of Classification Search
USPC .......................................................... 361/688
See application file for complete search history.

(56) References Cited

U.S. PATENT DOCUMENTS

| | | | |
|---|---|---|---|
| 6,052,280 | A | 4/2000 | Dilley et al. |
| 6,075,696 | A | 6/2000 | Progl et al. |
| 6,324,055 | B1 | 11/2001 | Kawabe |
| 7,417,863 | B2 | 8/2008 | Park |
| 7,573,710 | B2 | 8/2009 | Morino et al. |
| 7,969,739 | B2 | 6/2011 | Tsunoda et al. |
| 9,490,860 | B2 | 11/2016 | Wu |
| 9,939,672 | B2 | 4/2018 | Kakuda et al. |
| 9,961,809 | B1 | 5/2018 | Yoon et al. |
| 10,120,421 | B1 | 11/2018 | Hong et al. |
| 11,116,107 | B2* | 9/2021 | Chu .................. H10K 71/00 |
| 11,272,639 | B2* | 3/2022 | Yang .................. G06F 1/203 |
| 2015/0257290 | A1 | 9/2015 | Lee |
| 2015/0362791 | A1* | 12/2015 | Kakuda ............ G02F 1/133385 |
| | | | 349/61 |
| 2016/0029481 | A1 | 1/2016 | Augoustidis et al. |
| 2016/0212890 | A1* | 7/2016 | Jeong .................. G06F 1/16 |
| 2016/0334836 | A1 | 11/2016 | Hong et al. |
| 2017/0099736 | A1 | 4/2017 | Jung et al. |
| 2017/0215288 | A1* | 7/2017 | Shi .................. H05K 3/007 |
| 2017/0292053 | A1 | 10/2017 | Zaggl et al. |
| 2018/0284856 | A1 | 10/2018 | Shah |
| 2019/0041922 | A1 | 2/2019 | Kurma Raju et al. |
| 2019/0063854 | A1 | 2/2019 | Yoshida |
| 2019/0393433 | A1* | 12/2019 | Dagn .................. G09F 9/30 |
| 2020/0154581 | A1* | 5/2020 | Chen .................. H05K 1/147 |
| 2020/0245501 | A1 | 7/2020 | Wu et al. |
| 2020/0266368 | A1* | 8/2020 | Park .................. H10K 77/111 |
| 2021/0141419 | A1* | 5/2021 | Wang .................. G06F 1/203 |
| 2022/0061195 | A1* | 2/2022 | Lee .................. G06F 1/1601 |
| 2023/0209890 | A1* | 6/2023 | Cha .................. B32B 3/266 |
| | | | 257/40 |

FOREIGN PATENT DOCUMENTS

| | | |
|---|---|---|
| CN | 200965430 Y | 10/2007 |
| CN | 201044555 Y | 4/2008 |
| CN | 102032832 A | 4/2011 |
| CN | 102271486 A | 12/2011 |
| CN | 202143337 U | 2/2012 |
| CN | 204144262 U | 2/2015 |
| CN | 205883828 U | 1/2017 |
| CN | 106378984 A | 2/2017 |
| CN | 106499878 A | 3/2017 |
| CN | 106715636 A | 5/2017 |
| CN | 106973549 A | 7/2017 |
| CN | 104820314 B | 7/2018 |
| JP | 2008160029 | 7/2008 |
| JP | 2008177275 | 7/2008 |
| JP | 2011022528 A | 2/2011 |
| JP | 2012182398 A | 9/2012 |
| JP | 2016004782 A | 1/2016 |
| JP | 2017531918 A | 10/2017 |
| KR | 20150143302 A | 12/2015 |
| WO | 2016048335 A1 | 3/2016 |

\* cited by examiner

FILM-LIKE HEAT DISSIPATION MEMBER, BENDABLE DISPLAY APPARATUS, AND TERMINAL DEVICE

CROSS-REFERENCE TO RELATED APPLICATIONS

This application is a continuation of U.S. patent application Ser. No. 16/851,337, filed on Apr. 17, 2020, which is a continuation of International Application No. PCT/CN2018/093582, filed on Jun. 29, 2018, which claims priority to Chinese Patent Application No. 201710983771.0, filed on Oct. 20, 2017. All of the afore-mentioned patent applications are hereby incorporated by reference in their entireties.

TECHNICAL FIELD

This application relates to a heat dissipation member, and in particular, to a film-like heat dissipation member, and a bendable display apparatus and a terminal device to which the heat dissipation member is applied.

BACKGROUND

A bendable terminal, for example, a foldable mobile phone, can implement both large-screen experience of a tablet computer and portability of a mobile phone by using a flexible bending technology. The bendable terminal in an unfolded state is the tablet computer, and the bendable terminal in a bent state is the mobile phone. The bendable terminal connects two support members by using a bending member, and the support members separately or jointly support one display region. To provide experience such as a low latency and high smoothness and reduce wiring between two mainboards of the bendable terminal, main heating devices (such as a system on chip and a camera module) of the bendable terminal are usually integrated into one mainboard. As a result, heat of the bendable terminal is concentrated on one side. Moreover, devices at all layers are stretched or compressed in a process of bending the bendable terminal, and cutting-plane lengths, of the devices at the layers, of different cutting planes change. Therefore, a heat dissipation member that can be bent repeatedly is needed to transfer heat across the bending member, so that heat of the two mainboards is uniform. A heat-conducting material of an existing heat dissipation member is not elastic, cannot be bent repeatedly, and cannot be adapted to continuous changes in the cutting-plane lengths of the different cutting planes during repeated bending. However, an elastic material that can be bent repeatedly has a poor heat-conducting effect, and cannot transfer heat across a bending member; consequently, uniform temperatures on two sides of a foldable mobile phone cannot be implemented.

SUMMARY

Embodiments of the present invention provide a film-like heat dissipation member, and a bendable display apparatus and a terminal device to which the heat dissipation member is applied. The film-like heat dissipation member can be adapted to cutting-plane length changes in different cutting planes in a bending process, is capable of being repeatedly bent, and can transfer heat across a bending member to implement uniform temperatures on both sides of a foldable mobile phone.

According to a first aspect, an embodiment of the present invention provides a film-like heat dissipation member. The film-like heat dissipation member includes a heat dissipation layer, the heat dissipation layer is made of one or more layers of heat-conducting materials, and a surface of the heat dissipation layer includes a non-planar region and a planar region. The heat-conducting material in the non-planar region is corrugated, so that a cutting-plane length of the heat dissipation layer changes in a surface bending process based on the corrugated heat-conducting material. In a process of bending the film-like heat dissipation member, cutting-plane lengths of the film-like heat dissipation member change. For a heat dissipation layer that is made of the heat-conducting material and that has relatively poor elasticity, cutting-plane lengths of different cutting planes can change by compressing and stretching the corrugation shape in the non-planar region, so that the film-like heat dissipation member may be bent repeatedly.

Based on the first aspect, in some implementations, a shape of a hinge zone of the corrugated heat-conducting material in the non-planar region in any one or more of the following shapes: an arc, a chevron, and a box.

Based on the first aspect, in some implementations, there is at least one hinge zone.

Based on the first aspect, in some implementations, a connection between the non-planar region and the planar region is a continuous connection. In other words, the heat dissipation layer is a complete heat-conducting material.

Based on the first aspect, in some implementations, a corrugation in the non-planar region is a non-continuous corrugation in a direction parallel to that of a connection between the non-planar region and the planar region.

According to a second aspect, an embodiment of the present invention provides a film-like heat dissipation member. The film-like heat dissipation member includes a heat dissipation layer, a surface of the heat dissipation layer is formed by splicing an elastic material and a heat-conducting material, and the elastic material is spliced at any one or more ends of the heat-conducting material, so that a cutting-plane length of the heat dissipation layer changes in a surface bending process based on a length change in the elastic material; and the heat-conducting material spans two support members, so that the heat-conducting material covers an entire surface of a bending member. Splicing the elastic material allows the heat dissipation layer to be adapted to cutting-plane changes in different cutting planes based on high elasticity of the elastic material in a bending process, so that the film-like heat dissipation member can be bent repeatedly.

Based on the second aspect, in some implementations, a manner of splicing the elastic material and the heat-conducting material is adhering splicing surfaces, or inserting the elastic material into the heat-conducting material, or inserting the heat-conducting material into the elastic material.

According to a third aspect, an embodiment of the present invention provides a film-like heat dissipation member. The film-like heat dissipation member includes a heat dissipation layer, and a surface of the heat dissipation layer is formed by splicing at least two heat-conducting materials by using sawteeth, so that a cutting-plane length of the heat dissipation layer changes in a surface bending process based on misalignment of sawteeth during splicing. In this way, the film-like heat dissipation member can be bent repeatedly.

Based on the third aspect, in some implementations, the sawteeth are in any one of a rectangle, a trapezoid, a triangle, and a U-shape.

According to a fourth aspect, an embodiment of the present invention provides a film-like heat dissipation member. The film-like heat dissipation member is applied to a bendable apparatus, the bendable apparatus includes two support members and a bending member located between the two support members, a surface of the film-like heat dissipation member is attached to a surface of the bendable apparatus, cutting-plane lengths of the film-like heat dissipation member change as the bendable apparatus is bent, and the film-like heat dissipation member includes a heat dissipation layer. The heat dissipation layer is made of a heat-conducting material, a surface of the heat dissipation layer includes a non-planar region and a planar region, and the heat dissipation layer spans the two support members, so that the non-planar region covers a part of a surface or an entire surface of the bending member. The heat-conducting material in the non-planar region is corrugated, so that a cutting-plane length of the heat dissipation layer changes in a surface bending process based on the corrugated heat-conducting material. Heat on one support member on one side may be transferred across the bending member to the other support member on the other side by using the corrugated heat-conducting material for the non-planar region of the heat dissipation layer in the film-like heat dissipation member. This expands a heat dissipation area, and can implement uniform temperatures of the support members on the two sides.

Based on the fourth aspect, in some implementations, is a shape of a hinge zone of the corrugated heat-conducting material in the non-planar region in any one or more of the following shapes: an arc, a chevron, and a box.

Based on the fourth aspect, in some implementations, there is at least one hinge zone.

Based on the fourth aspect, in some implementations, a connection between the non-planar region and the planar region is a continuous connection.

Based on the fourth aspect, in some implementations, a corrugation in the non-planar region is a non-continuous corrugation in a direction parallel to that of a connection between the non-planar region and the planar region.

According to a fifth aspect, an embodiment of the present invention provides a film-like heat dissipation member. The film-like heat dissipation member is applied to a bendable apparatus, the bendable apparatus includes two support members and a bending member located between the two support members, a surface of the film-like heat dissipation member is attached to a surface of the bendable apparatus, cutting-plane lengths of the film-like heat dissipation member change as the bendable apparatus is bent, and the film-like heat dissipation member includes a heat dissipation layer. A surface of the heat dissipation layer is formed by splicing an elastic material and a heat-conducting material, and the elastic material is spliced at any one or more ends of the heat-conducting material, so that a cutting-plane length of the film-like heat dissipation member changes in a surface bending process based on a length change in the elastic material; and the heat-conducting material spans the two support members, so that the heat-conducting material covers an entire surface of the bending member. Heat on one support member on one side may be transferred across the bending member to the other support member on the other side by using the heat-conducting material of the film-like heat dissipation member. This expands a heat dissipation area, and can implement uniform temperatures of the support members on the two sides.

Based on the fifth aspect, in some implementations, a manner of splicing the elastic material and the heat-conducting material is adhering splicing surfaces, or inserting the elastic material into the heat-conducting material, or inserting the heat-conducting material into the elastic material.

According to a sixth aspect, an embodiment of the present invention provides a film-like heat dissipation member. The film-like heat dissipation member is applied to a bendable apparatus, the bendable apparatus includes two support members and a bending member located between the two support members, a surface of the film-like heat dissipation member is attached to a surface of the bendable apparatus, cutting-plane lengths of the film-like heat dissipation member change as the bendable apparatus is bent, and the film-like heat dissipation member includes a heat dissipation layer. A surface of the heat dissipation layer is formed by splicing at least two heat-conducting materials by using sawteeth, so that cutting-plane lengths of the film-like heat dissipation member change in a surface bending process based on misalignment of sawteeth during splicing. Heat on one support member on one side may be transferred across the bending member to the other support member on the other side by using the heat-conducting material of the film-like heat dissipation member. This expands a heat dissipation area, and can implement uniform temperatures of the support members on the two sides.

Based on the sixth aspect, in some implementations, the sawteeth are in any one of a rectangle, a trapezoid, a triangle, and a U-shape.

According to a seventh aspect, an embodiment of the present invention provides a bendable display apparatus. The bendable display apparatus includes a display panel, a bendable apparatus, and a film-like heat dissipation member located between the display panel and the bendable apparatus. The bendable apparatus includes two support members and a bending member, the display panel includes a display region, and the display region includes a first display region, a second display region, and a bending region limited between the first display region and the second display region; one support member supports a first region, of the display panel, corresponding to the first display region; the other support member supports a second region, of the display panel, corresponding to the second display region; the bending member connects between the two support members to overlap the bending region, and guides the display panel to be bent or unfolded to be in a planar state relative to the bending region; and a surface of the film-like heat dissipation member is attached to a surface of the bendable apparatus, cutting-plane lengths of the film-like heat dissipation member change as the bendable apparatus is bent, and the film-like heat dissipation member is the film-like heat dissipation member according to any one of the first aspect or the implementations of the first aspect. Heat on one support member on one side may be transferred across the bending member to the other support member on the other side by using the heat-conducting material of the film-like heat dissipation member. This expands a heat dissipation area, and can implement uniform temperatures of the support members on the two sides, thereby improving an overall heat dissipation capability of the bendable display apparatus.

According to an eighth aspect, an embodiment of the present invention provides a bendable display apparatus. The bendable display apparatus includes a display panel, a bendable apparatus, and a film-like heat dissipation member located between the display panel and the bendable apparatus. The bendable apparatus includes two support members and a bending member, the display panel includes a display region, and the display region includes a first display region, a second display region, and a bending region limited between the first display region and the second display region; one support member supports a first region, of the display panel, corresponding to the first display region; the other support member supports a second region, of the display panel, corresponding to the second display region; the bending member connects between the two support members to overlap the bending region, and guides the display panel to be bent or unfolded to be in a planar state relative to the bending region; and a surface of the film-like heat dissipation member is attached to a surface of the bendable apparatus, cutting-plane lengths of the film-like heat dissipation member change as the bendable apparatus is bent, and the film-like heat dissipation member is the film-like heat dissipation member according to any one of the second aspect or the implementations of the second aspect. Heat on one support member on one side may be transferred across the bending member to the other support member on the other side by using the heat-conducting material of the film-like heat dissipation member. This expands a heat dissipation area, and can implement uniform temperatures of the support members on the two sides, thereby improving an overall heat dissipation capability of the bendable display apparatus.

According to a ninth aspect, an embodiment of the present invention provides a bendable display apparatus. The bendable display apparatus includes a display panel, a bendable apparatus, and a film-like heat dissipation member located between the display panel and the bendable apparatus. The bendable apparatus includes two support members and a bending member, the display panel includes a display region, and the display region includes a first display region, a second display region, and a bending region limited between the first display region and the second display region; one support member supports a first region, of the display panel, corresponding to the first display region; the other support member supports a second region, of the display panel, corresponding to the second display region; the bending member connects between the two support members to overlap the bending region, and guides the display panel to be bent or unfolded to be in a planar state relative to the bending region; and a surface of the film-like heat dissipation member is attached to a surface of the bendable apparatus, cutting-plane lengths of the film-like heat dissipation member change as the bendable apparatus is bent, and the film-like heat dissipation member is the film-like heat dissipation member according to any one of the third aspect or the implementations of the third aspect. Heat on one support member on one side may be transferred across the bending member to the other support member on the other side by using the heat-conducting material of the film-like heat dissipation member. This expands a heat dissipation area, and can implement uniform temperatures of the support members on the two sides, thereby improving an overall heat dissipation capability of the bendable display apparatus.

According to a tenth aspect, an embodiment of the present invention provides a terminal device, including a bendable display apparatus. The bendable display apparatus is the bendable display apparatus according to the seventh aspect. Heat on one support member on one side may be transferred across a bending member to the other support member on the other side by using a heat-conducting material of a film-like heat dissipation member. This expands a heat dissipation area, and can implement uniform temperatures of the support members on the two sides, thereby improving an overall heat dissipation capability of the terminal device.

According to an eleventh aspect, an embodiment of the present invention provides a terminal device, including a bendable display apparatus. The bendable display apparatus is the bendable display apparatus according to the eighth aspect. Heat on one support member on one side may be transferred across a bending member to the other support member on the other side by using a heat-conducting material of a film-like heat dissipation member. This expands a heat dissipation area, and can implement uniform temperatures of the support members on the two sides, thereby improving an overall heat dissipation capability of the terminal device.

According to a twelfth aspect, an embodiment of the present invention provides a terminal device, including a bendable display apparatus. The bendable display apparatus is the bendable display apparatus according to the ninth aspect. Heat on one support member on one side may be transferred across a bending member to the other support member on the other side by using a heat-conducting material of a film-like heat dissipation member. This expands a heat dissipation area, and can implement uniform temperatures of the support members on the two sides, thereby improving an overall heat dissipation capability of the terminal device.

BRIEF DESCRIPTION OF DRAWINGS

To describe the technical solutions in the embodiments of the present invention more clearly, the following briefly describes the accompanying drawings required for describing the embodiments. Obviously, these accompanying drawings merely show some embodiments of the present invention, and a person of ordinary skill in the art can derive other drawings from these accompanying drawings without creative efforts.

DESCRIPTION OF EMBODIMENTS

First, several concepts introduced in this application are described.

A heat-conducting material is a metal or non-metal material having high heat-conducting property (a heat-conducting coefficient may be greater than 10 W/m K, but the value does not constitute any limitation). In this application, the heat-conducting material may be copper foil or graphite.

An elastic material is a material that has specific elasticity and that can be compressed or stretched, and an elasticity coefficient is not limited. For example, the elasticity coefficient of the elastic material may be greater than that of a heat-conducting material in the same embodiment. In this application, for example, the elastic material may be foam, rubber, polyimide, or a composite material that is made of polyimide and another organic material.

An adhesive layer is a material layer that implements an adhesion function, can also have specific elasticity, and can be compressed or stretched. There may be one or more adhesive layers.

This application provides a film-like heat dissipation member that may be applied to a bendable terminal device, to provide a heat dissipation solution for the bendable terminal device. The bendable terminal device may be an electronic device in a flexible or bendable form, such as a mobile phone, a tablet computer, a notebook computer, or a multimedia playback device.

An embodiment of the present invention provides a bendable terminal device, including a bendable display apparatus.

Figure 1:
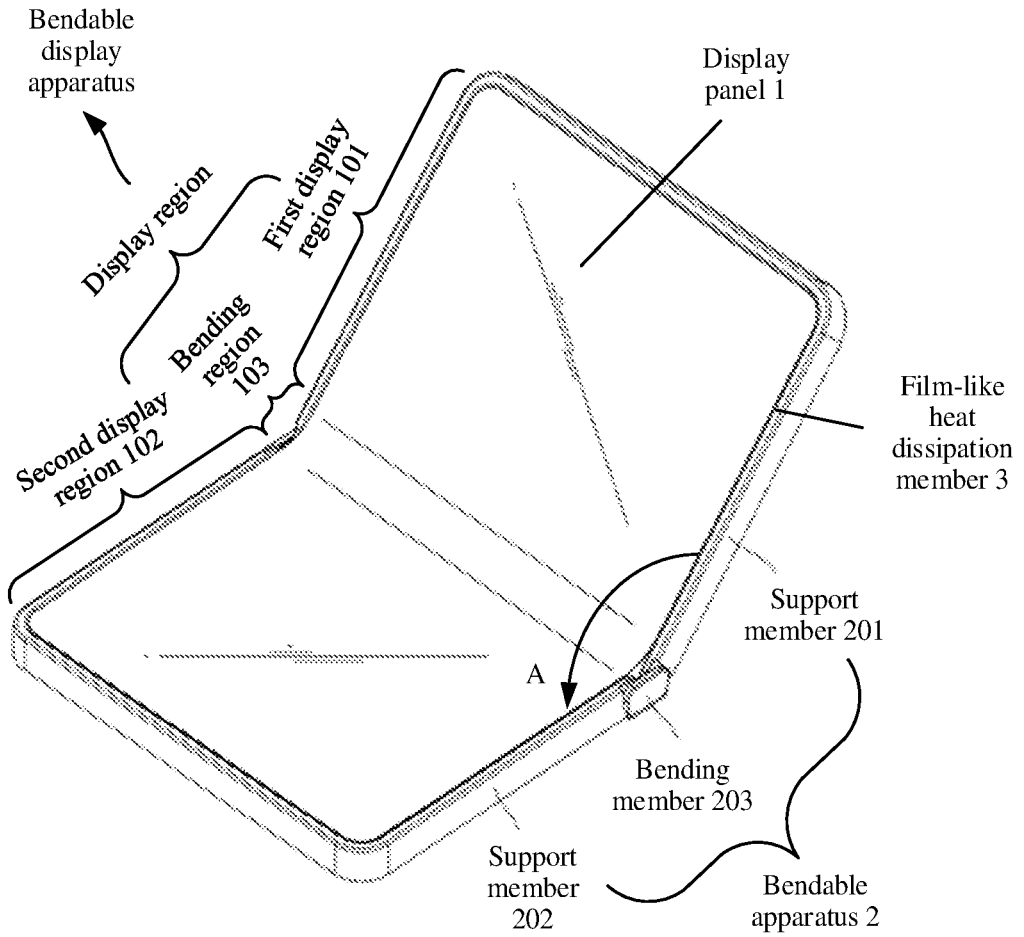
FIG. 1 is a schematic diagram of a bendable display apparatus.

FIG. 1 is a schematic diagram of the bendable display apparatus. The bendable display apparatus may include a display panel 1, a bendable apparatus 2, and a film-like heat dissipation member 3 located between the display panel 1 and the bendable apparatus 2. The display panel 1 may include a display region, and the display region includes a first display region 101, a second display region 102, and a bending region 103 limited between the first display region 101 and the second display region 102. In another embodiment of the present invention, the film-like heat dissipation member may alternatively be located on an outer side of the bendable apparatus.

As shown in FIG. 1, the bendable apparatus 2 includes two support members 201 and 202 and a bending member 203. One support member (for example, the support member 201) supports a first region, of the display panel, corresponding to the first display region 101; and the other support member (for example, the support member 202) supports a second region, of the display panel, corresponding to the second display region 102. The bending member 203 connects between the two support members to overlap the bending region 103, and guides the display panel to be folded or unfolded to be in a planar state relative to the bending region 103. For example, the display panel is folded in a direction A as shown in the figure. In another embodiment of the present invention, the display panel may alternatively be folded in a direction opposite to a direction A.

Figure 2:
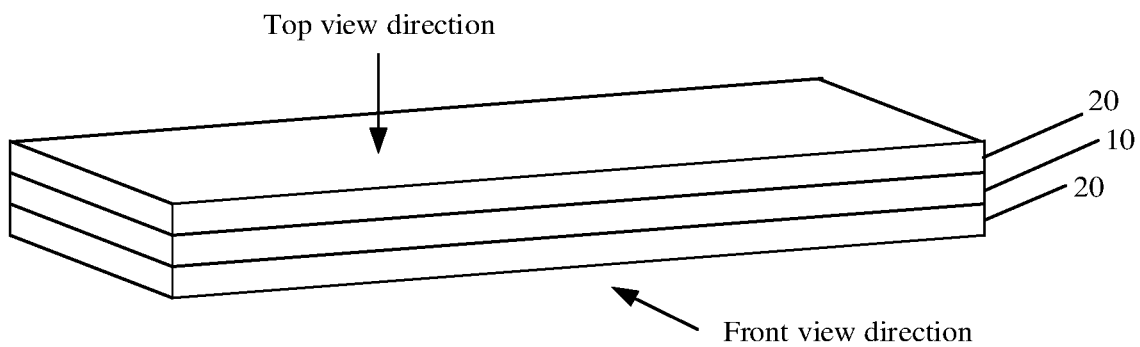
FIG. 2 is a schematic diagram of a film-like heat dissipation member according to an embodiment of the present invention.

FIG. 2 is a schematic diagram of a film-like heat dissipation member according to an embodiment of the present invention. The film-like heat dissipation member includes a heat dissipation layer 10, and the film-like heat dissipation member may further include a protective layer 20 located on a surface of the heat dissipation layer 10. The protective layer 20 may be made of an elastic material. There may be one or more adhesive layers (not shown in FIG. 2) between the protective layer and the heat dissipation layer.

Figure 3:
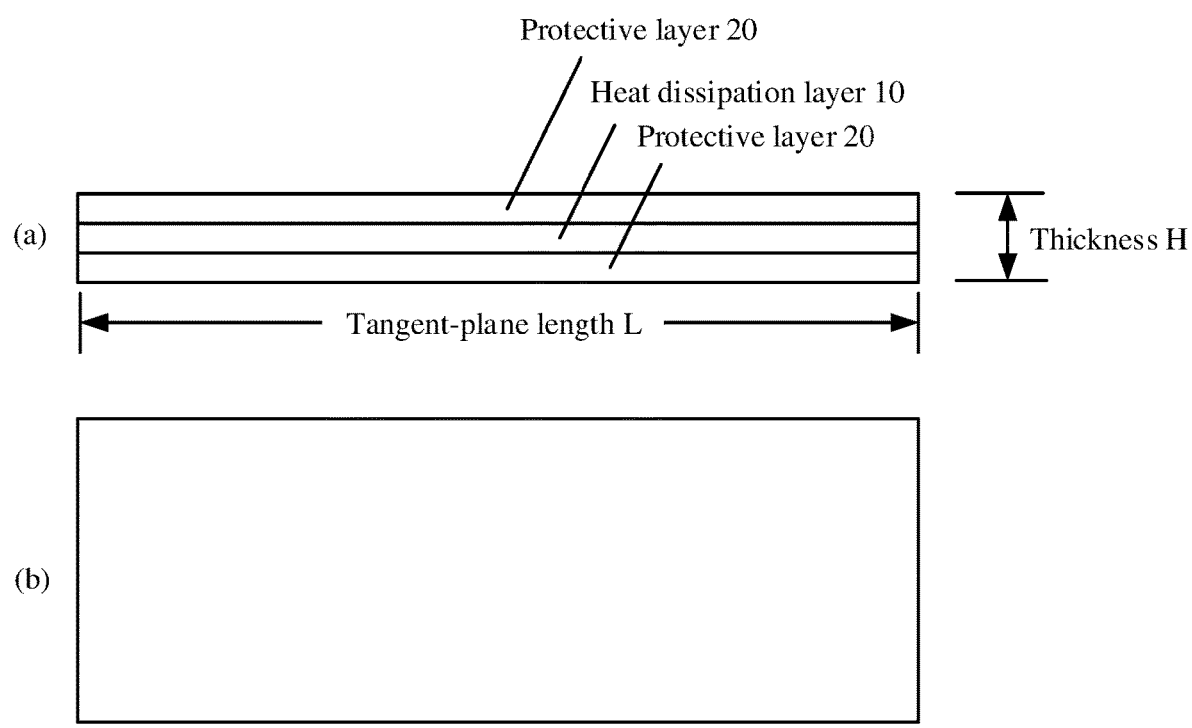
FIG. 3 is a front view and a top view of a film-like heat dissipation member according to an embodiment of the present invention.

As shown in FIG. 3, (a) in FIG. 3 is a front view of the film-like heat dissipation member shown in FIG. 2, and (b) in FIG. 3 is a top view of the film-like heat dissipation member shown in FIG. 3, and the shape is a rectangle in this example, but is not limited to the rectangle in another embodiment. As shown in (b) in FIG. 3, cutting-plane lengths of the film-like heat dissipation member in an unfolded state are all L, and a thickness of the film-like heat dissipation member is H in (a) in FIG. 3.

Figure 4:
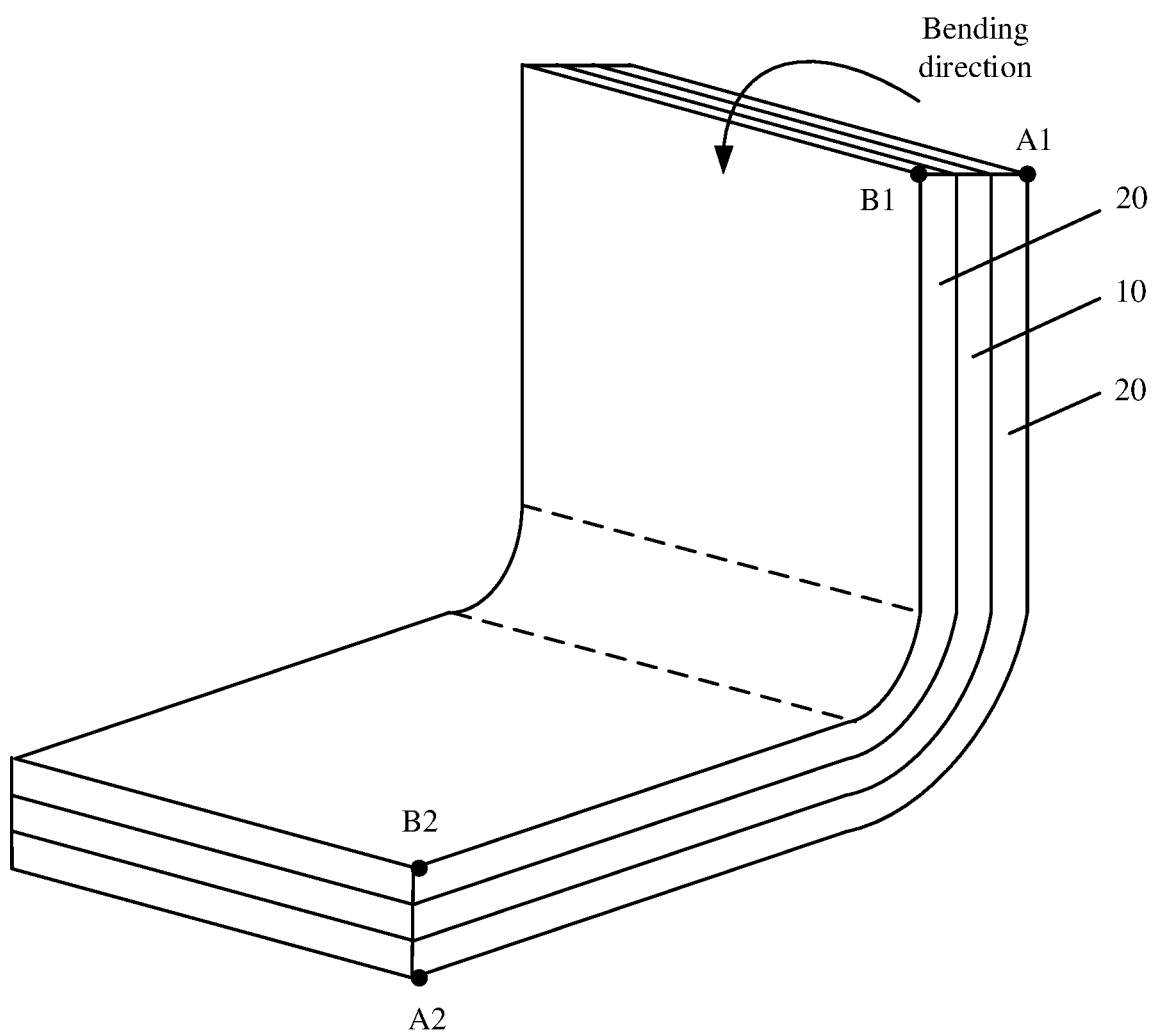
FIG. 4 is a schematic diagram of a film-like heat dissipation member in a bent state according to an embodiment of the present invention.

In a process of bending the film-like heat dissipation member, the cutting-plane lengths of the film-like heat dissipation member change. FIG. 4 is a schematic diagram of the film-like heat dissipation member shown in FIG. 2 in a bent state. In FIG. 4, an arc between A1 and A2 and an arc between B1 and B2 are on different cutting planes of the film-like heat dissipation member, and the cutting planes are vertical to a thickness direction. Lengths of the arc between A1 and A2 and the arc between B1 and B2 are cutting-plane lengths of the different cutting planes of the film-like heat dissipation member, and the cutting-plane lengths are L1 and L2. Because the film-like heat dissipation material is compressed or stretched based on elasticity of the film-like heat dissipation material in the bending process, different cutting-plane lengths of the film-like heat dissipation material change. It may be known that L1>L>L2.

Figure 5:
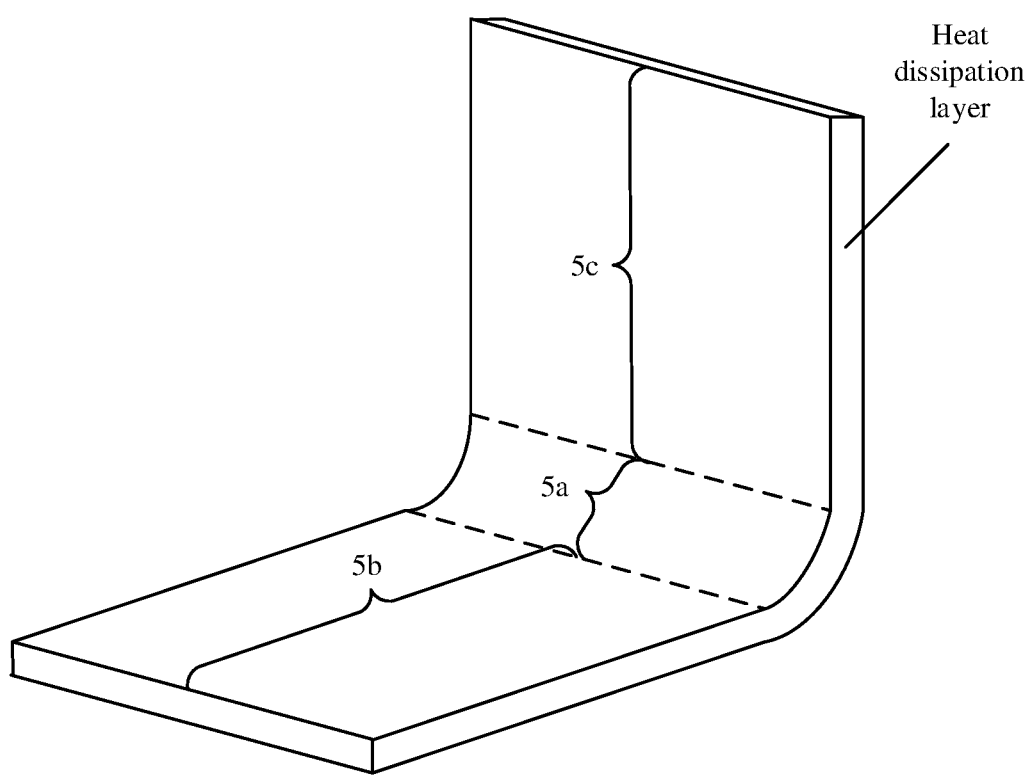
FIG. 5 is a schematic diagram of a heat dissipation layer of a film-like heat dissipation member in a bent state according to an embodiment of the present invention.

An embodiment of the present invention provides a film-like heat dissipation member, including a heat dissipation layer. FIG. 5 shows the heat dissipation layer in a bent state. A surface of the heat dissipation layer includes a non-planar region 5a and planar regions 5b and 5c, and the heat dissipation layer may be made of one or more layers of heat-conducting materials. A connection between a non-planar region and a planar region is a continuous connection. In other words, the heat dissipation layer is a complete heat-conducting material.

Figure 6:
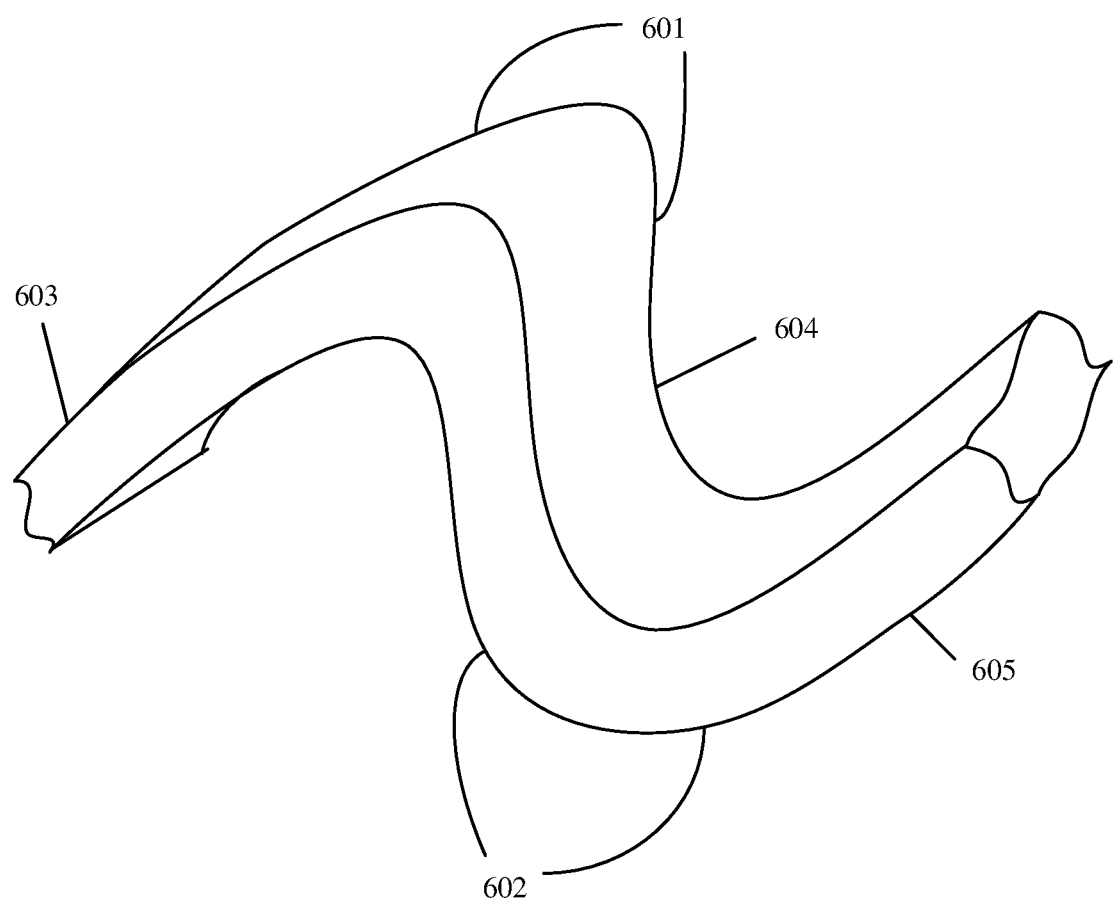
FIG. 6 is a schematic diagram of a corrugation.
Figure 7:
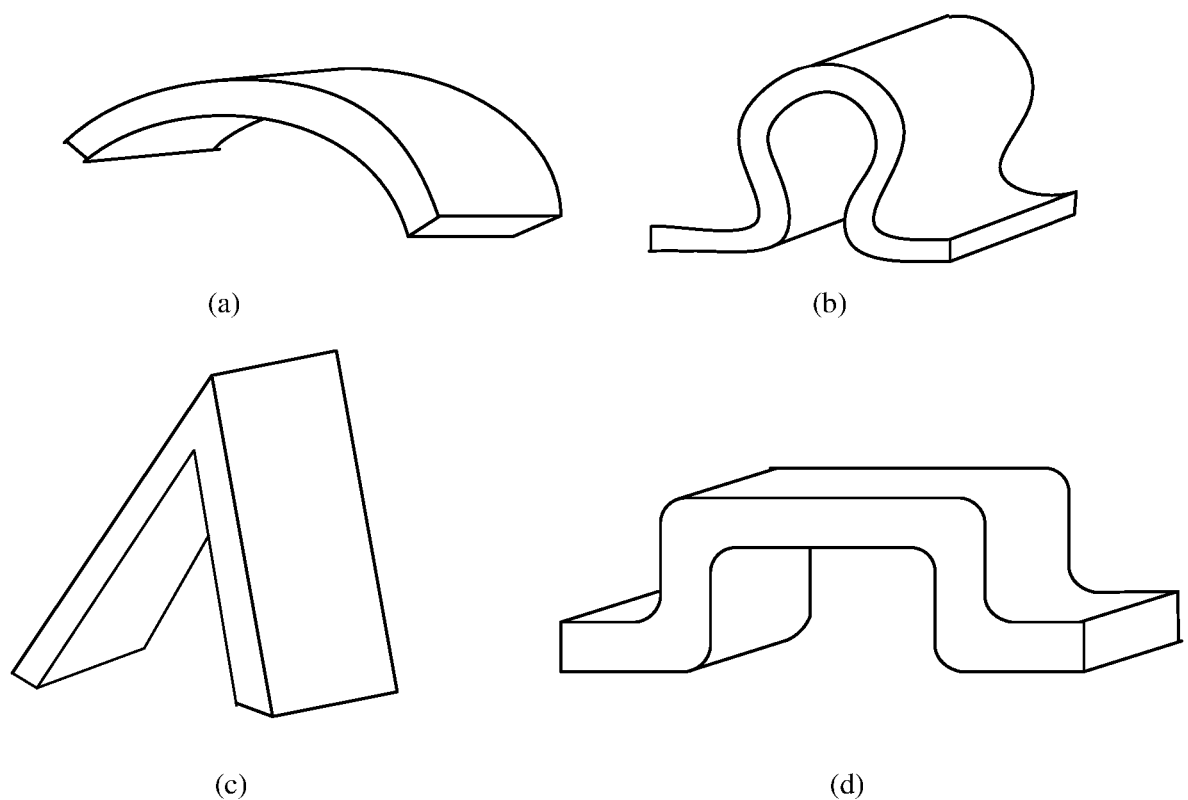
FIG. 7 is a schematic diagram of a hinge zone of a corrugation.

The heat-conducting material in the non-planar region 5a may be corrugated. FIG. 6 is a schematic diagram of a corrugation. Each hinge zone (for example, 601 in FIG. 6) in the corrugation connects two limbs (for example, 603 and 604 in FIG. 6). The hinge zones (601 and 602) may be in any one or more of the following shapes: an arc ((a) in FIG. 7 and (b) in FIG. 7), a chevron ((c) in FIG. 7), or a box ((d) in FIG. 7). The non-planar region 5a includes at least one hinge zone.

The following describes a structure of the film-like heat dissipation member in detail by using an example in which the hinge zone of the corrugation shape is arc-shaped.

Figure 8:
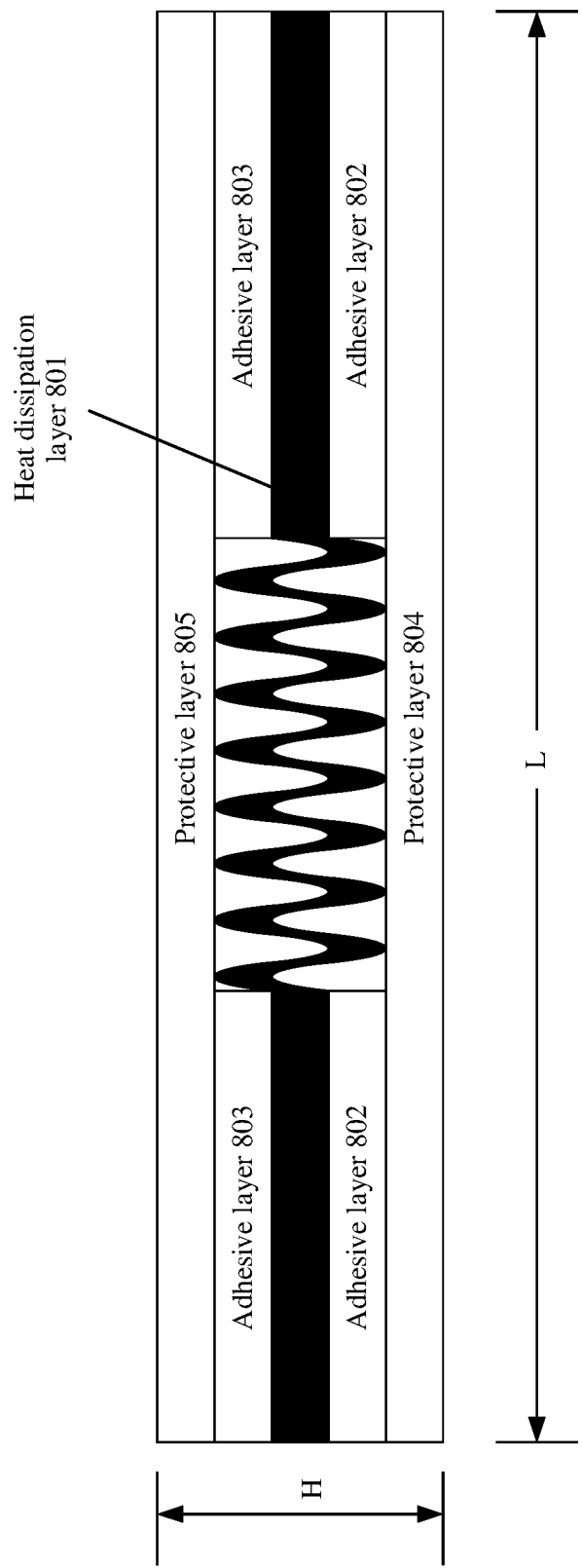
FIG. 8 is a front view of a film-like heat dissipation member in an unfolded state according to an embodiment of the present invention.

FIG. 8 is a front view of a film-like heat dissipation member 800 in an unfolded state according to an embodiment of the present invention. The film-like heat dissipation member includes a heat dissipation layer 801, and further includes adhesive layers (802 and 803) on surfaces of the heat dissipation layer, and protective layers (804 and 805) adhered to the heat dissipation layer by using the adhesive layers. Adhesive layers may not be disposed between a non-planar region and the protective layers of the heat dissipation layer 801. A heat-conducting material in the non-planar region of the heat dissipation layer 801 is corrugated (which may also be understood as rippled), and a hinge zone of the corrugation shape is arc-shaped. A cutting-plane length of the film-like heat dissipation member 800 in the unfolded state is L, and a thickness of a planar region of the film-like heat dissipation member is H.

Figure 9:
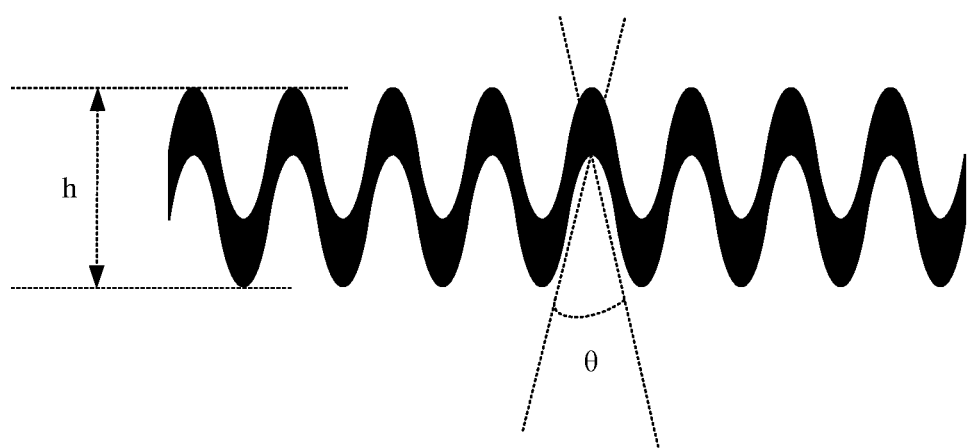
FIG. 9 is a side view of a corrugation with an arc-shaped hinge zone.

FIG. 9 is a schematic diagram of a corrugation with an arc-shaped hinge zone. As shown in FIG. 9, a height h between adjacent hinge zones in the corrugation may be set as required, and may be greater than H, or may be less than or equal to H. An angle θ formed by two limbs connected by the hinge zone may be 1° to 179°. There is at least one hinge zone in the corrugation.

Figure 10:
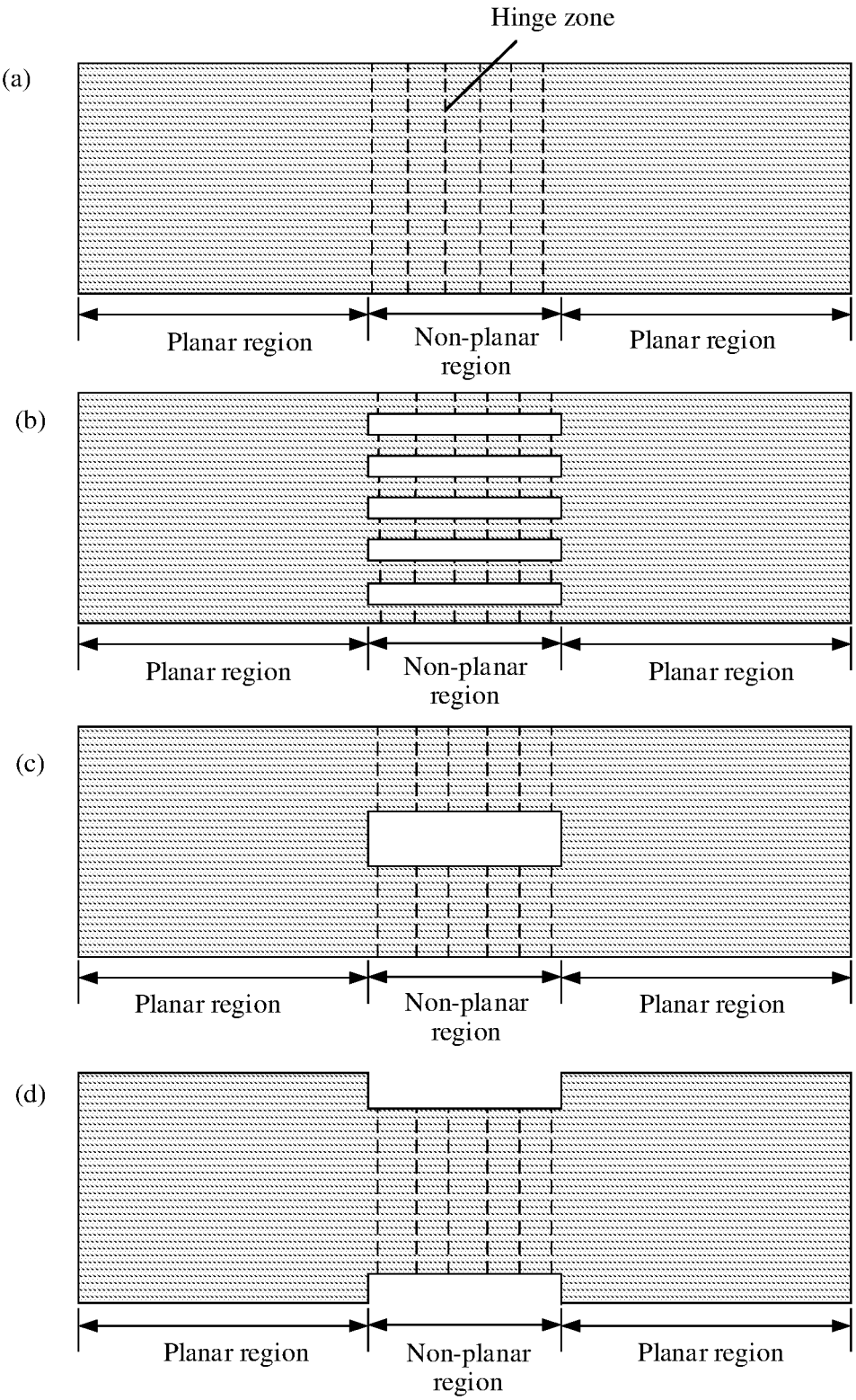
FIG. 10 is a top view of a heat dissipation layer in the unfolded state in FIG. 8.

FIG. 10 is a top view of the heat dissipation layer in FIG. 8 in an unfolded state. Dashed lines represent the hinge zone of the corrugation in the non-planar region in FIG. 8. In FIG. 10, the corrugation in the non-planar region may be a continuous corrugation in a direction parallel to that of a connection between a non-planar region and a planar region, as shown in (a) in FIG. 10, or may be a non-continuous corrugation, as shown in (b), (c), and (d) in FIG. 10. FIG. 10 merely presents some possible schematic diagrams and does not impose any limitation.

Figure 11:
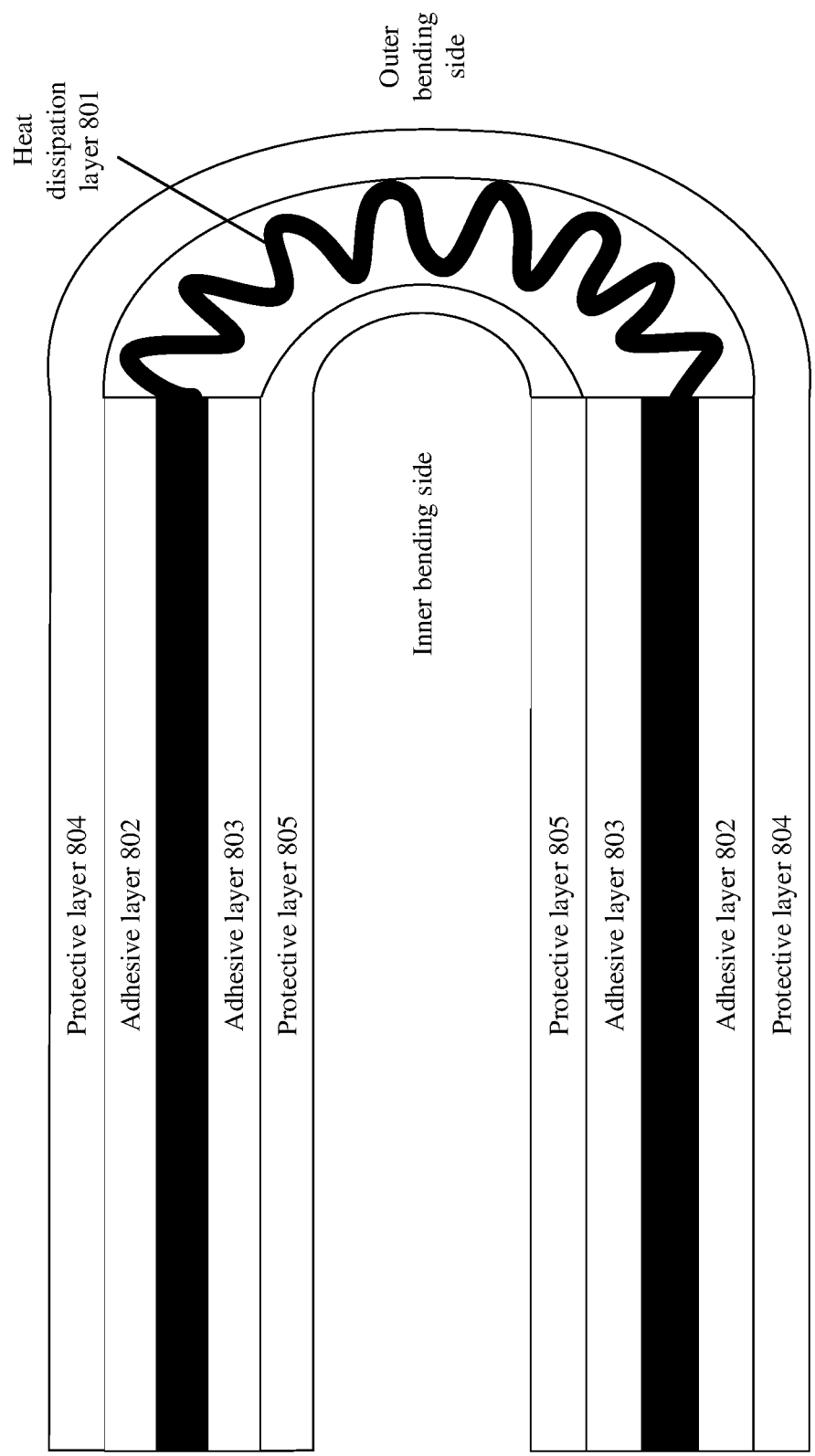
FIG. 11 is a front view of a film-like heat dissipation member in a bent state according to an embodiment of the present invention.

FIG. 11 is a front view of the film-like heat dissipation member 800 in a bent state according to an embodiment of the present invention.

In a process of bending the film-like heat dissipation member, cutting-plane lengths of the film-like heat dissipation member change. As shown in FIG. 11, the film-like heat dissipation member in the non-planar region is compressed on an inner bending side, and the film-like heat dissipation member in the non-planar region is stretched on an outer bending side. A protective layer and an adhesive layer that have elasticity can be adapted to a cutting-plane length change in the film-like heat dissipation member in the bending process based on length changes in the protective layer and the adhesive layer. In this embodiment of the present invention, for a heat dissipation layer that is made of a heat-conducting material and that has relatively poor elasticity, a cutting-plane length can change by compressing and stretching a corrugation in the non-planar region, without compressing or stretching the heat-conducting material. In this way, the heat-conducting material of the heat dissipation layer of the film-like heat dissipation member provided in this embodiment of the present invention may be bent repeatedly.

Figure 12A:
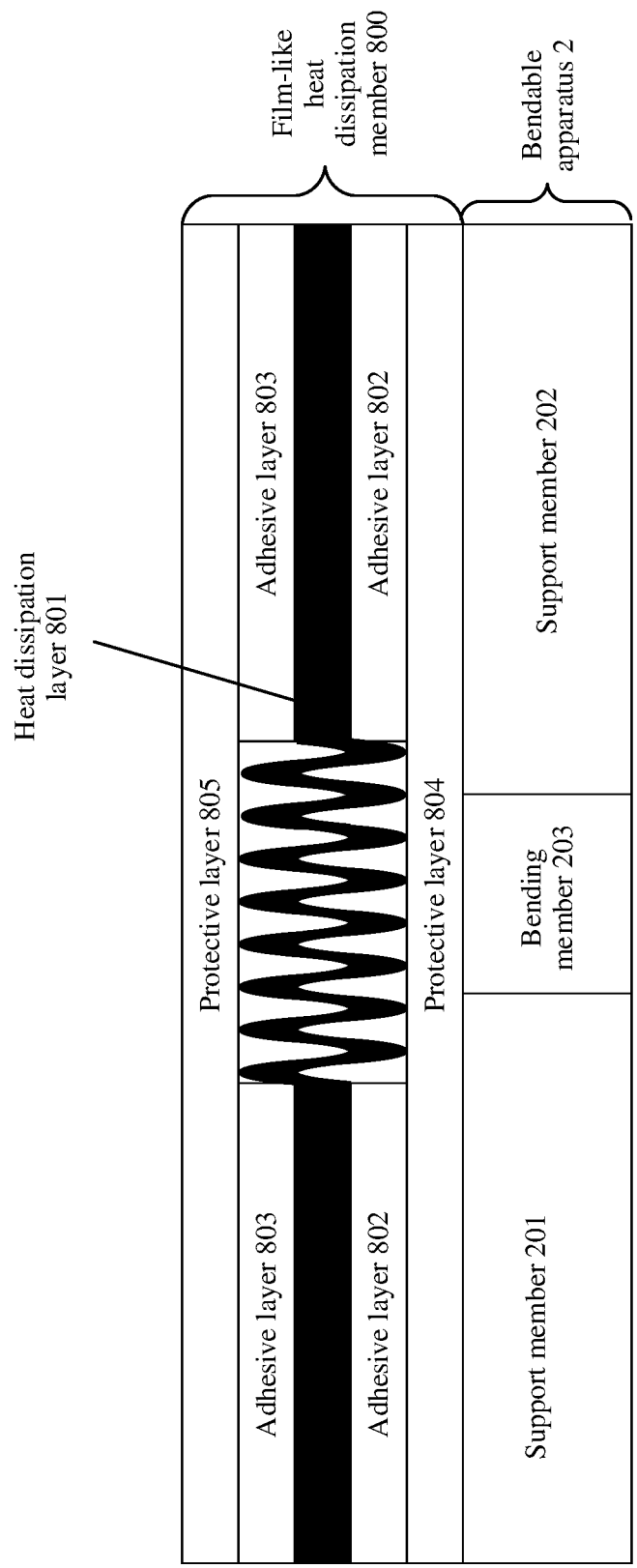
FIG. 12a is a front view of a film-like heat dissipation member applied to a bendable apparatus according to an embodiment of the present invention.
Figure 12B:
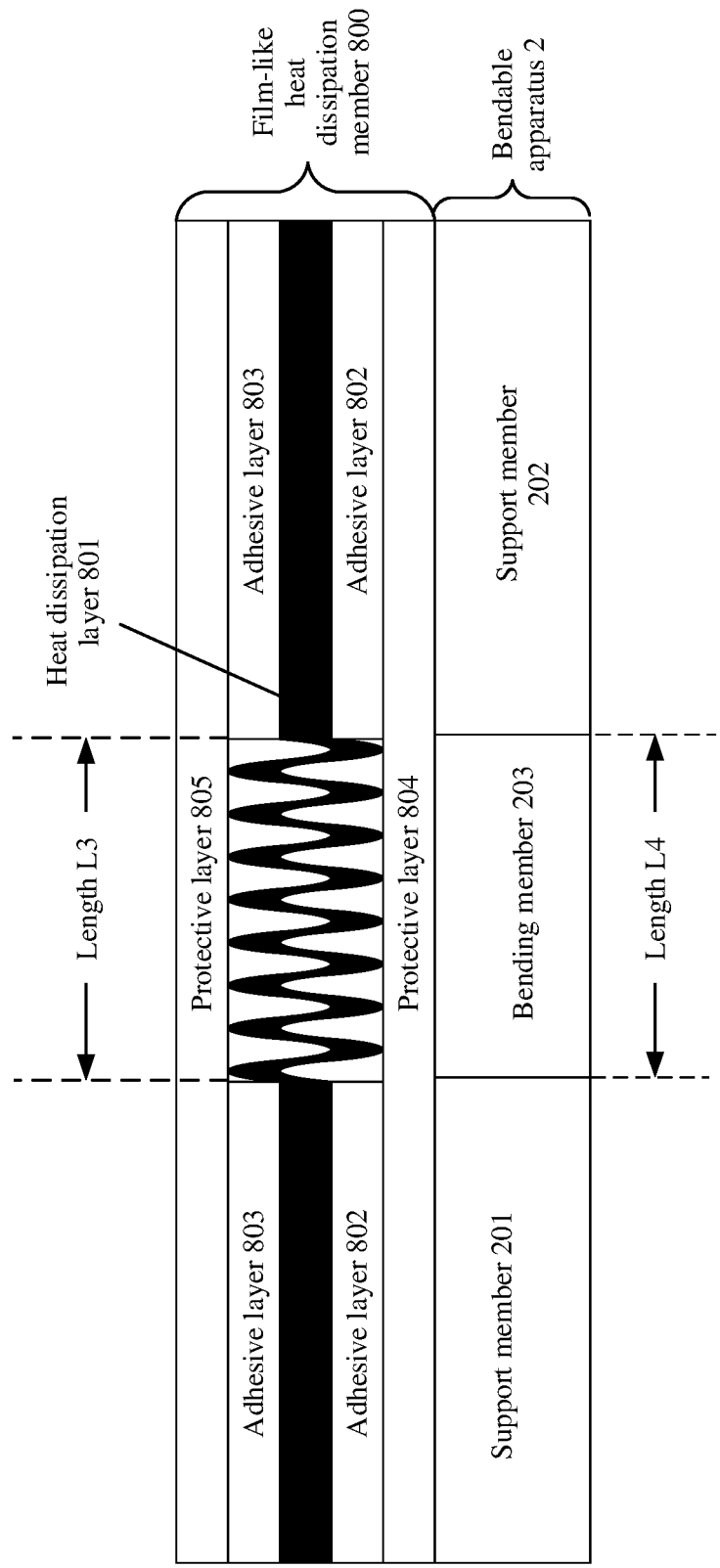
FIG. 12b is a front view of a film-like heat dissipation member applied to a bendable apparatus according to an embodiment of the present invention.
Figure 12C:
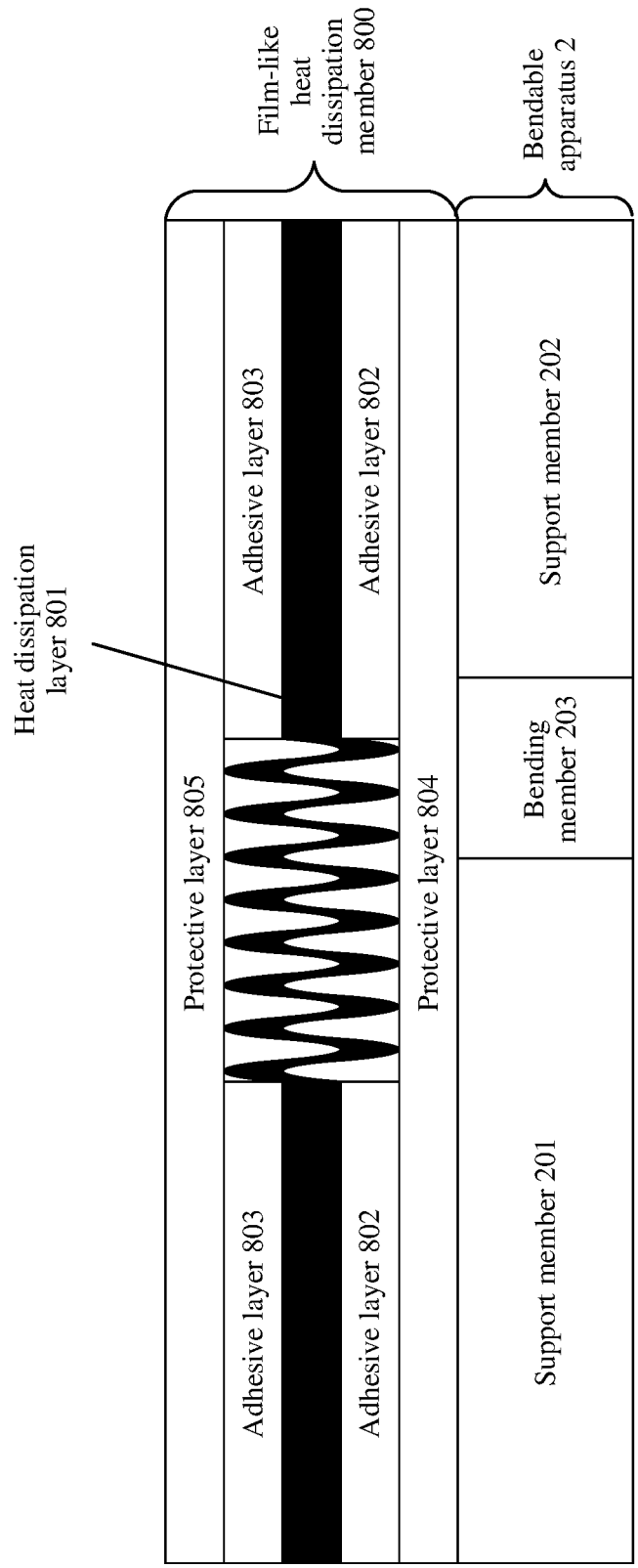
FIG. 12c is a front view of a film-like heat dissipation member applied to a bendable apparatus according to an embodiment of the present invention.

An embodiment of the present invention provides a film-like heat dissipation member, applied to a bendable apparatus. The following describes, by using the film-like heat dissipation member 800 as an example, a specific structure in which the film-like heat dissipation member 800 provided in this embodiment of the present invention is applied to the bendable apparatus 2. FIG. 12a to FIG. 12c are front views showing that the film-like heat dissipation member 800 is applied to the bendable apparatus. The film-like heat dissipation member includes the heat dissipation layer 801. The bendable apparatus 2 includes the two support members 201 and 202 and the bending member 203 located between the two support members. A surface of the film-like heat dissipation member is directly or indirectly attached to a surface of the bendable apparatus by using a protective layer. Cutting-plane lengths of the film-like heat dissipation member change as the bendable apparatus is bent. The heat dissipation layer 801 is made of a heat-conducting material, the surface of the heat dissipation layer includes a non-planar region and a planar region, and the heat dissipation layer spans the two support members, so that the non-planar region covers a part of a surface or an entire surface of the bending member 203. As shown in FIG. 12a and FIG. 12b, the non-planar region covers the entire surface of the bending member 203. As shown in FIG. 12c, the non-planar region covers the part of the surface of the bending member 203. As shown in FIG. 12b, a length of the non-planar region of the heat dissipation layer is L3, and a length of the bending member 203 is L4. In this case, L3 may be greater than or equal to L4, or may be less than L4.

The heat-conducting material in the non-planar region is corrugated, so that cutting-plane lengths of the film-like heat dissipation member change in a bending process based on the corrugated heat-conducting material.

In addition, heat on one support member on one side may be transferred across the bending member to the other support member on the other side by using the corrugated heat-conducting material for the non-planar region of the heat dissipation layer in the film-like heat dissipation member. This expands a heat dissipation area, and can implement uniform temperatures of the support members on the two sides, thereby improving overall heat dissipation capabilities of a bendable display apparatus and a bendable terminal.

An embodiment of the present invention provides a film-like heat dissipation member.

Figure 13:
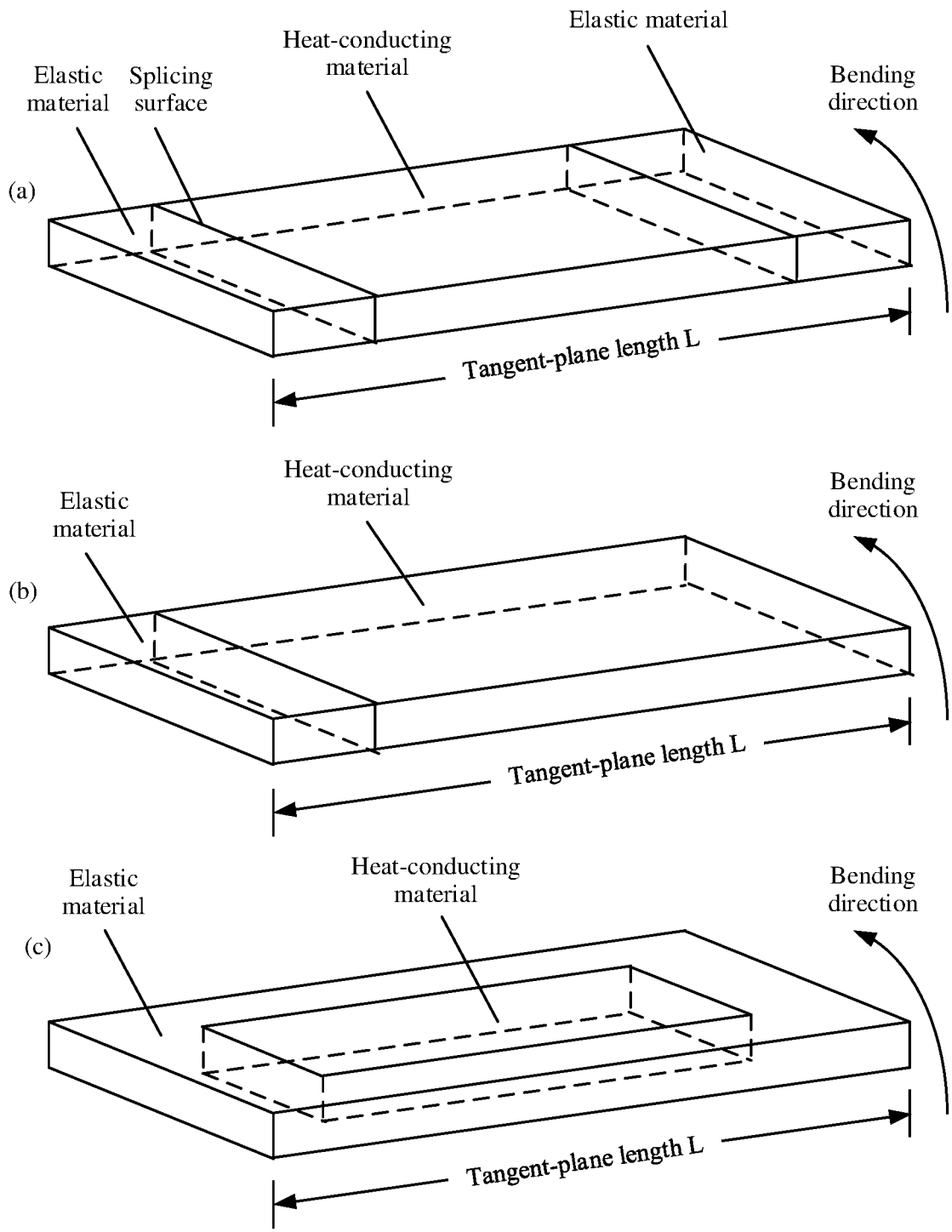
FIG. 13 is a schematic diagram of a heat dissipation layer of a film-like heat dissipation member in an unfolded state according to an embodiment of the present invention.

The film-like heat dissipation member includes a heat dissipation layer, a surface of the heat dissipation layer is formed by splicing an elastic material and a heat-conducting material, and the elastic material is spliced at any one or more ends of the heat-conducting material, so that the heat dissipation layer may be stretched and compressed in a process of bending the surface. FIG. 13 is a schematic diagram of the heat dissipation layer in an unfolded state. In (a) in FIG. 13, the elastic material is spliced at two ends of the heat-conducting material; in (b) in FIG. 13, the elastic material is spliced at one end of the heat-conducting material; and in (c) in FIG. 13, the elastic material is spliced around the heat-conducting material.

Specifically, splicing surfaces are adhered, or the elastic material is inserted into the heat-conducting material, or the heat-conducting material is inserted into the elastic material. The splicing surfaces may be planes as shown in FIG. 13, or may be sawtooth-shaped.

Figure 14A:
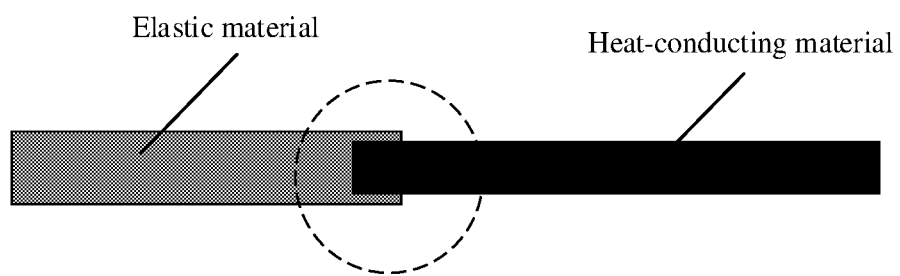
FIG. 14a is a schematic diagram of a manner of splicing an elastic material and a heat-conducting material.
Figure 14B:
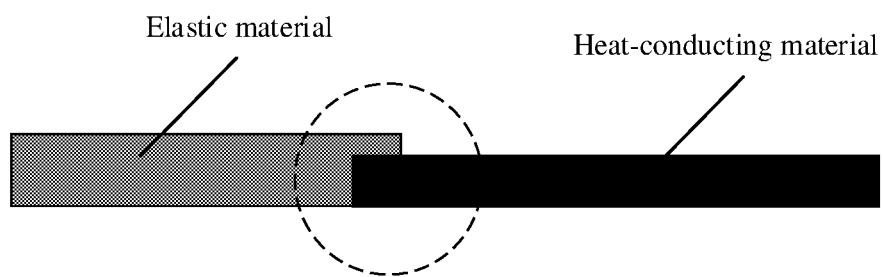
FIG. 14b is a schematic diagram of a manner of splicing an elastic material and a heat-conducting material.

Using that the heat-conducting material is inserted into the elastic material as an example, splicing manners may be shown in FIG. 14a and FIG. 14b.

Figure 15:
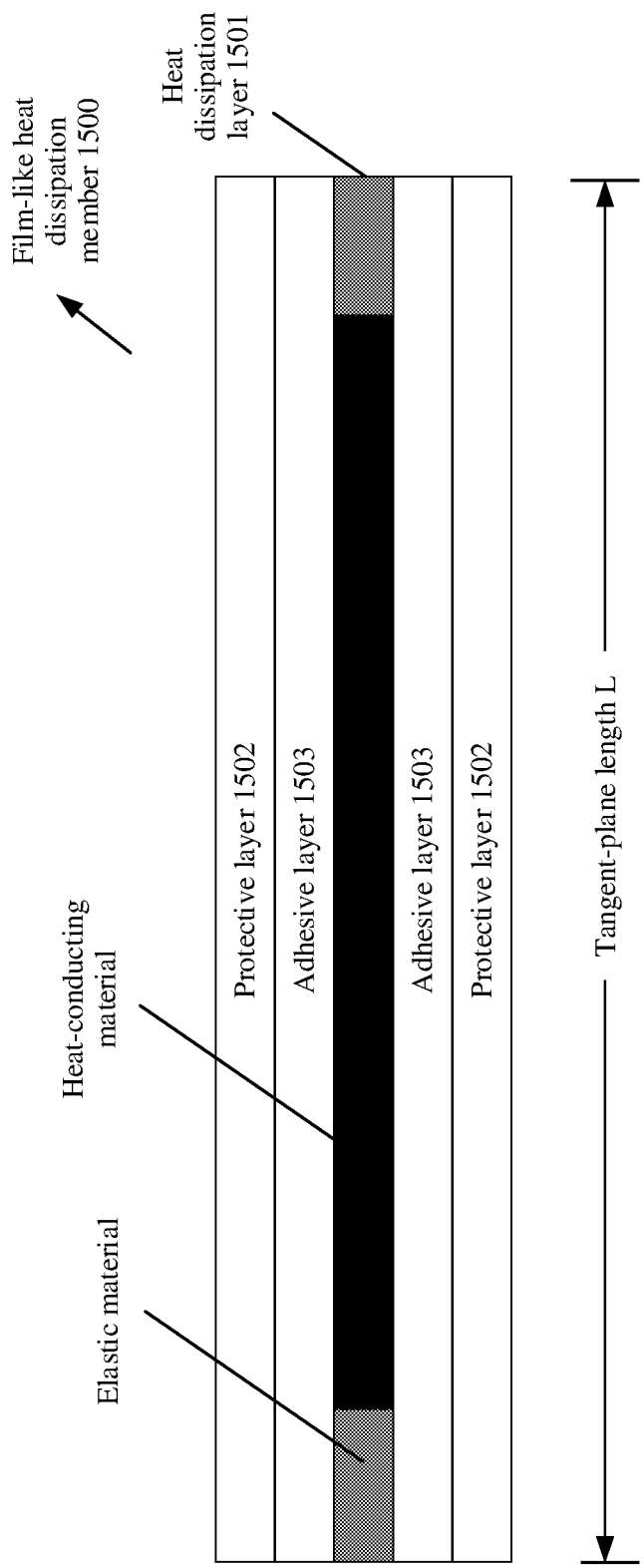
FIG. 15 is a front view of a film-like heat dissipation member in an unfolded state according to an embodiment of the present invention.

As shown in FIG. 15, a film-like heat dissipation member 1500 may further include a protective layer 1502 located on a surface of a heat dissipation layer 1501. The protective layer and the heat dissipation layer may be adhered to each other by using an adhesive layer 1503, and the protective layer may be made of one or more layers of elastic materials.

When the film-like heat dissipation member 1500 is bent, the protective layer and the adhesive layer that have elasticity can be adapted to cutting-plane length changes in different cutting planes in the bending process based on length changes in the protective layer and the adhesive layer. For the heat dissipation layer, in this embodiment of the present invention, splicing the elastic material allows the heat dissipation layer to be adapted to the cutting-plane length changes in the different cutting planes based on high elasticity of the elastic material in the bending process.

Figure 16:
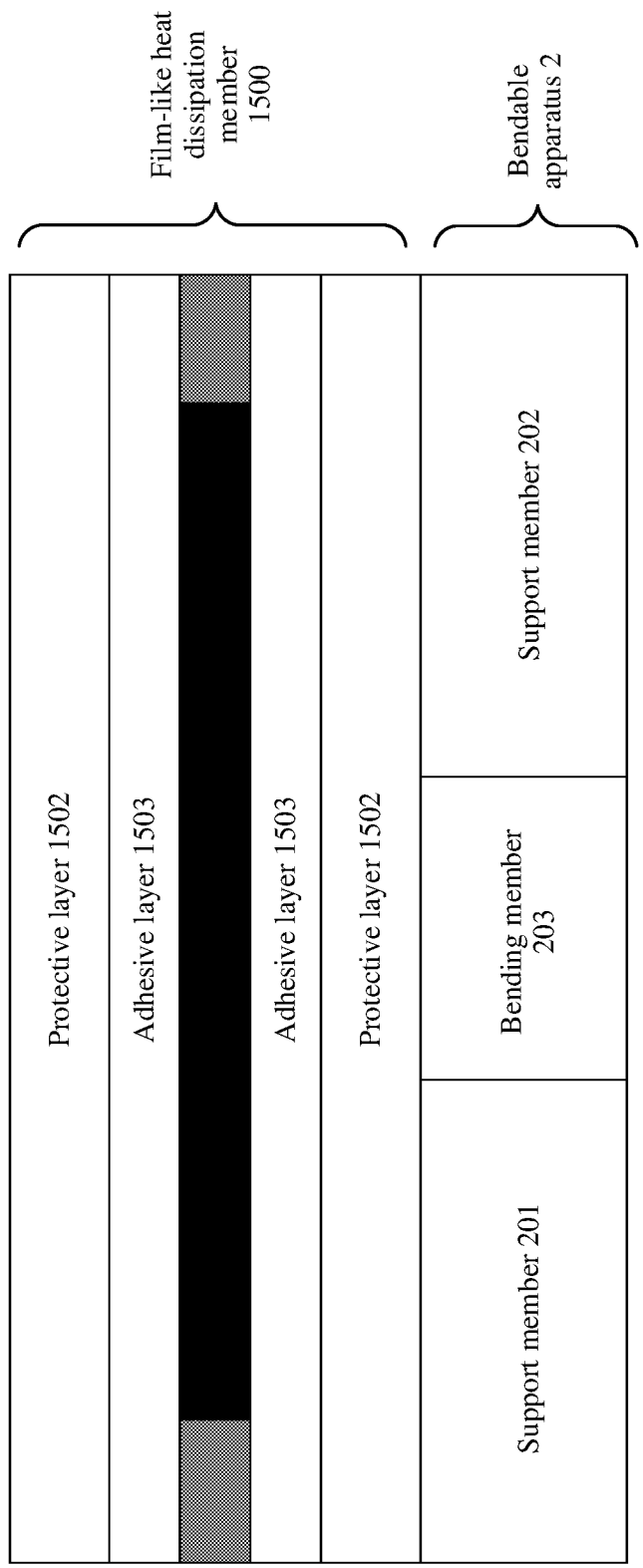
FIG. 16 is a front view of a film-like heat dissipation member applied to a bendable apparatus according to an embodiment of the present invention.

An embodiment of the present invention provides a film-like heat dissipation member, applied to a bendable apparatus. FIG. 16 is a front view showing that the film-like heat dissipation member 1500 is applied to the bendable apparatus 2. The bendable apparatus 2 includes the two support members 201 and 202 and the bending member 203 located between the two support members. A surface of the film-like heat dissipation member 1500 is directly or indirectly attached to a surface of the bendable apparatus 2 by using a protective layer. A cutting-plane length of the film-like heat dissipation member 1500 changes as the bendable apparatus 2 is bent. A heat-conducting material spans the two support members, so that the heat-conducting material covers an entire surface of the bending member.

In addition, heat on one support member on one side may be transferred across the bending member to the other support member on the other side by using the heat-conducting material of the film-like heat dissipation member. This expands a heat dissipation area, and can implement uniform temperatures of the support members on the two sides, thereby improving overall heat dissipation capabilities of a bendable display apparatus and a bendable terminal.

Figure 17:
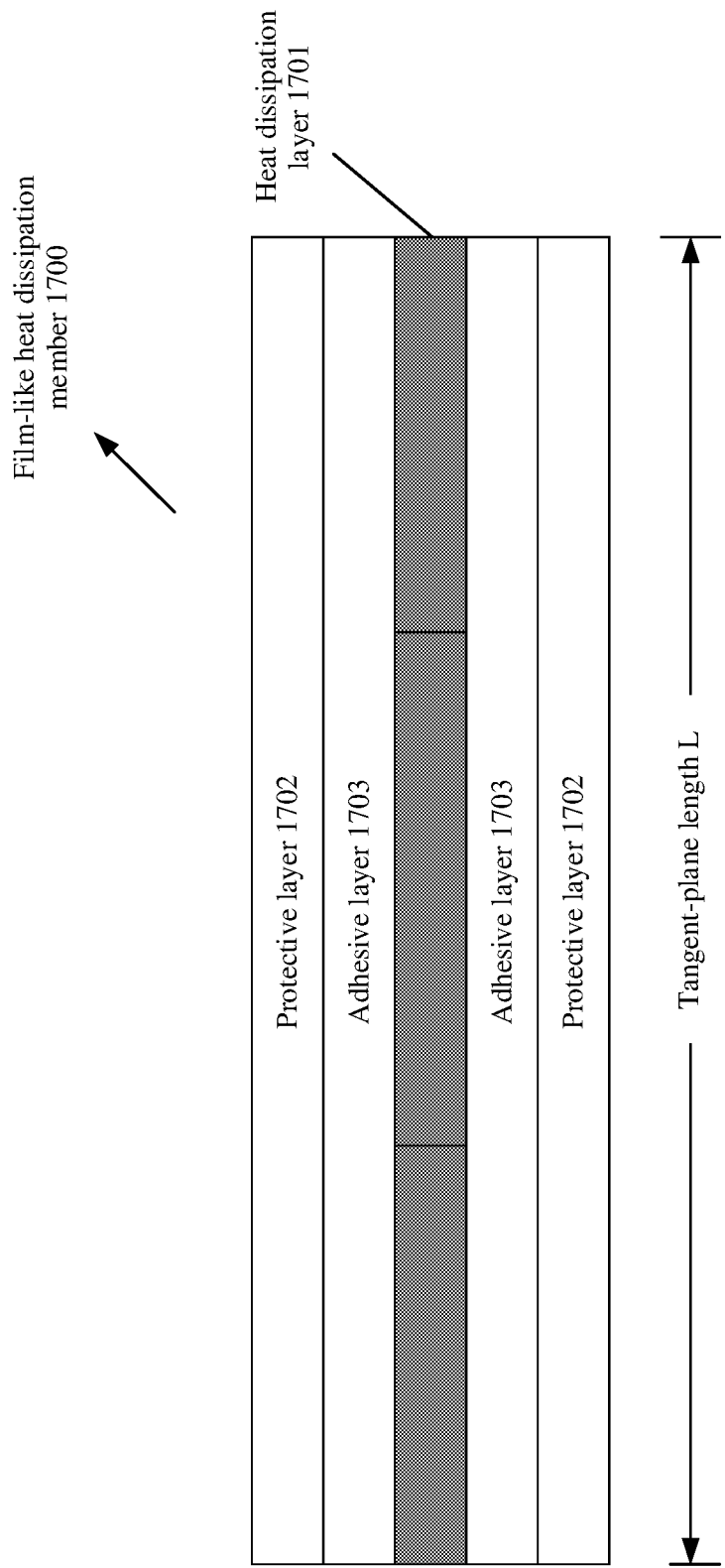
FIG. 17 is a front view of a film-like heat dissipation member in an unfolded state according to an embodiment of the present invention.

An embodiment of the present invention provides a film-like heat dissipation member 1700, including a heat dissipation layer 1701. FIG. 17 is a front view of the film-like heat dissipation member 1700. The film-like heat dissipation member 1700 further includes a protective layer 1702 on a surface of a heat dissipation layer 1701. The protective layer and the heat dissipation layer may be adhered to each other by using an adhesive layer 1703, and the protective layer may be made of one or more layers of elastic materials.

The surface of the heat dissipation layer 1701 is formed by splicing at least two heat-conducting materials by using sawteeth.

Figure 18:
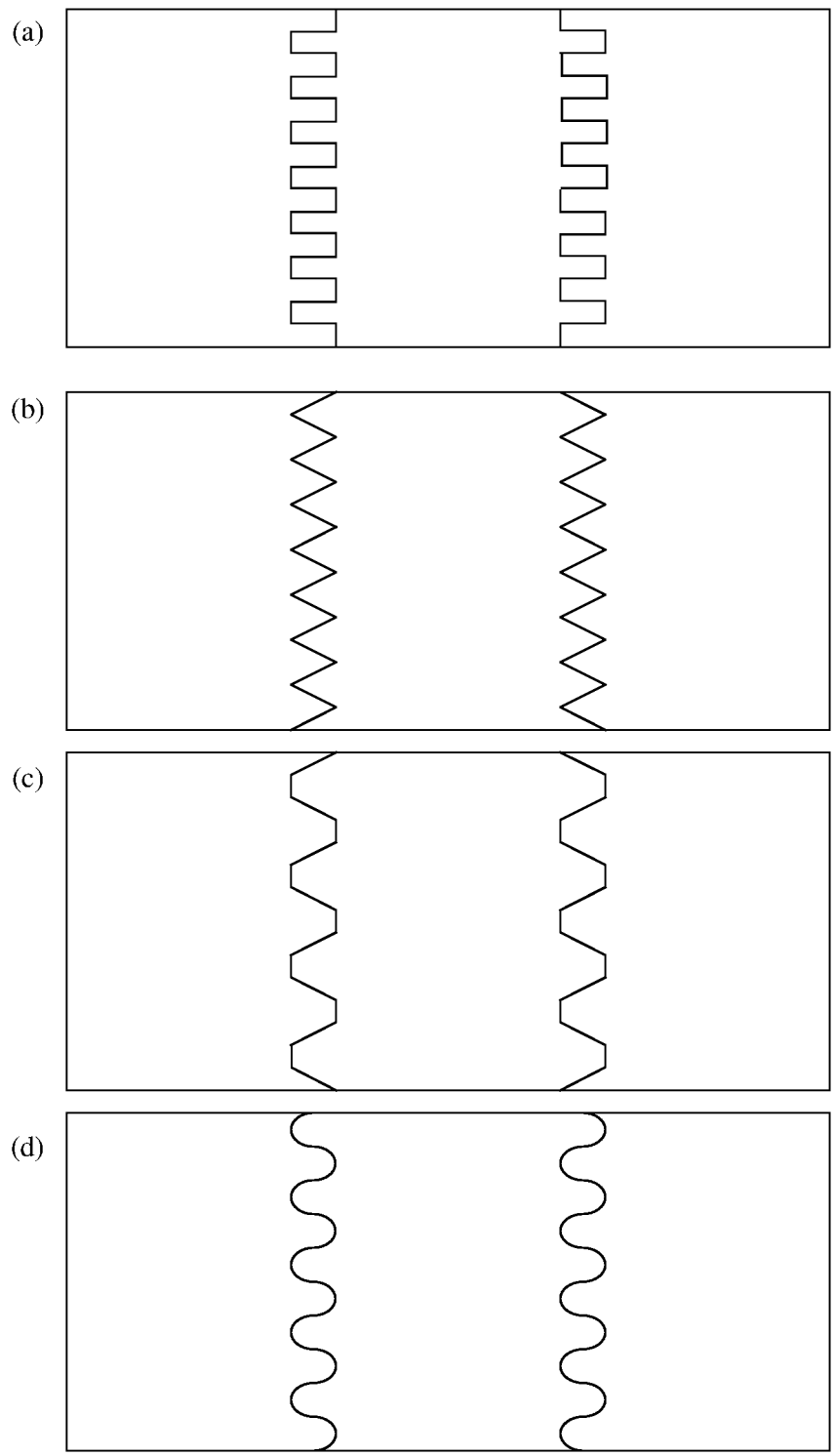
FIG. 18 is a top view of a heat dissipation layer formed by splicing three heat-conducting materials by using sawteeth.

Specifically, the sawteeth are in any one of a rectangle, a triangle, a trapezoid, and a U-shape, and corresponding top views are shown in (a), (b), (c), and (d) in FIG. 18, respectively. The heat dissipation layer in FIG. 18 is formed by splicing three heat-conducting materials by using sawteeth.

Figure 19:
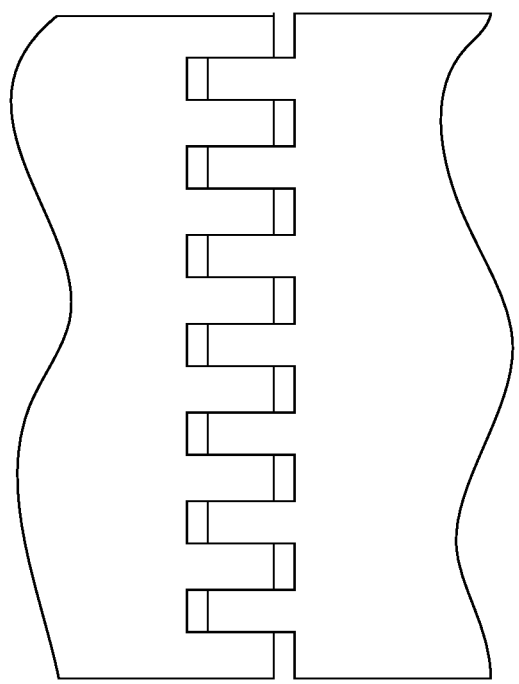
FIG. 19 is a schematic diagram of misalignment of rectangular sawteeth.

When the film-like heat dissipation member 1700 is bent, the protective layer and the adhesive layer that have elasticity can be adapted to cutting-plane length changes in different cutting planes in the bending process based on length changes in the protective layer and the adhesive layer. However, the cutting-plane lengths of the different cutting planes of the heat dissipation layer change through misalignment of sawteeth during splicing. FIG. 19 is a schematic diagram of misalignment of rectangular sawteeth.

Figure 20:
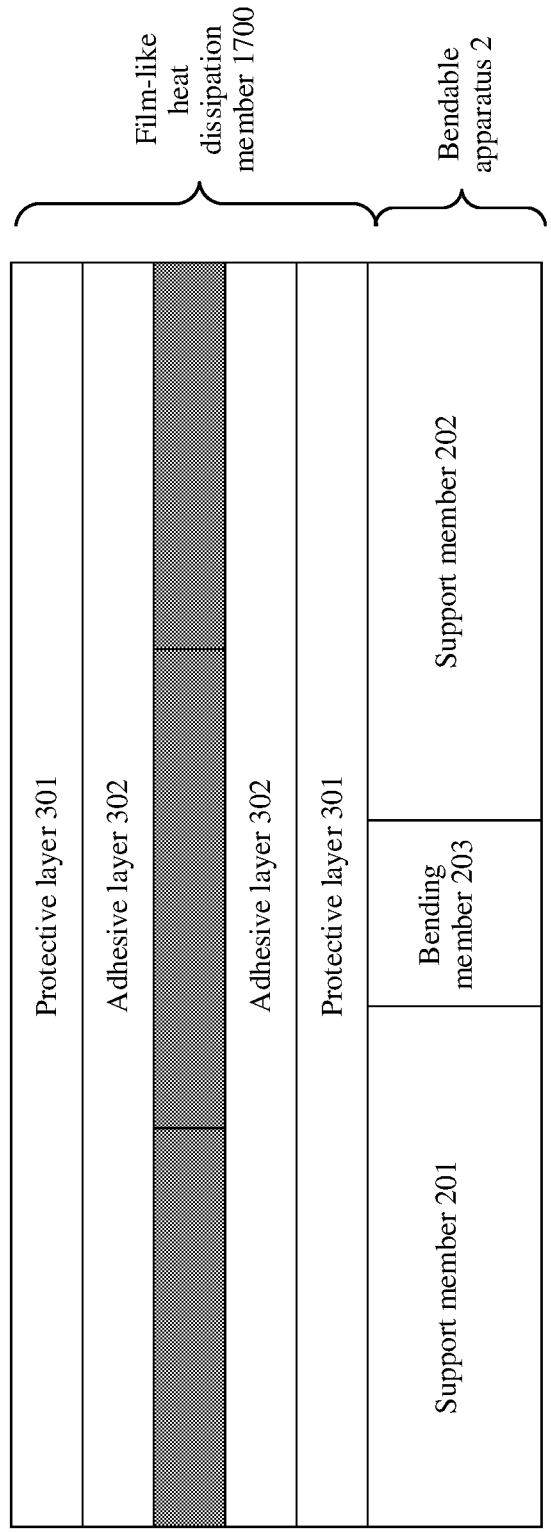
FIG. 20 is a front view of a film-like heat dissipation member applied to a bendable apparatus according to an embodiment of the present invention.

An embodiment of the present invention provides a film-like heat dissipation member, applied to a bendable apparatus. FIG. 20 is a front view showing that the film-like heat dissipation member 1700 is applied to the bendable apparatus 2. The bendable apparatus 2 includes the two support members 201 and 202 and the bending member 203 located between the two support members. A surface of the film-like heat dissipation member 1700 is directly or indirectly attached to a surface of the bendable apparatus 2 by using a protective layer. A cutting-plane length of the film-like heat dissipation member 1700 changes as the bendable apparatus 2 is bent.

In addition, heat on one support member on one side may be transferred across the bending member to the other support member on the other side by using the heat-conducting material of the film-like heat dissipation member. This expands a heat dissipation area, and can implement uniform temperatures of the support members on the two sides, thereby improving overall heat dissipation capabilities of a bendable display apparatus and a bendable terminal.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A film-like heat dissipation member, applied to a bendable apparatus comprising:
    two support members and a bending member located between the two support members, wherein a surface of the film-like heat dissipation member is attached to a surface of the bendable apparatus, and the film-like heat dissipation member comprises a first protective layer, a first adhesive layer, a heat dissipation layer, a second adhesive layer and a second protective layer that are staked in sequence, and the first protective layer, the second protective layer, the first adhesive layer and the second adhesive layer have elasticity;
    wherein the heat dissipation layer comprises a heat-conducting material, the heat-conducting material is copper foil or graphite, and a surface of the heat dissipation layer comprises a non-planar region and a planar region, the non-planar region covers at least a part of a surface of the bending member, the heat-conducting material in the non-planar region has a corrugated structure that is compressible and stretchable when the film-like heat dissipation member is unfolded in a planar state, and lengths of planes of the film-like heat dissipation member change as the corrugated structure is compressed or stretched, the planes being perpendicular to a thickness direction of the film-like heat dissipation member.

2. The film-like heat dissipation member according to claim 1, wherein
    a shape of a hinge zone of the corrugated structure in the non-planar region is any one or more of: an arc, a chevron, or a box.

3. The film-like heat dissipation member according to claim 2, wherein the corrugated structure comprise at least one hinge zone.

4. The film-like heat dissipation member according to claim 1, wherein a connection between the non-planar region and the planar region is a continuous connection.

5. The film-like heat dissipation member according to claim 1, wherein the non-planar region comprises one or more cut out regions.

6. The film-like heat dissipation member according to claim 1, wherein the surface of the heat dissipation layer further comprises another planar region, and the non-planar region connects the planar region with the other planar region.

7. The film-like heat dissipation member according to claim 6, wherein
the heat-conducting material in the non-planar region is stretched on an outer portion and compressed on an inner portion to cause the planar region and the other planar region to extend in parallel planes.

8. A bendable display apparatus, comprising
a display panel, a bendable apparatus, and a film-like heat dissipation member located between the display panel and the bendable apparatus,
wherein the bendable apparatus comprises two support members and a bending member, the display panel comprises a display region, and the display region comprises a first display region, a second display region, and a bending region between the first display region and the second display region; one of the two support members supports a first region, of the display panel, corresponding to the first display region; the other one of the two support members supports a second region, of the display panel, corresponding to the second display region; the bending member connects between the two support members to overlap the bending region, and guides the display panel to be bent or unfolded to be in a planar state relative to the bending region; and a surface of the film-like heat dissipation member is attached to a surface of the bendable apparatus;
wherein the film-like heat dissipation member comprises a first protective layer, a first adhesive layer, a heat dissipation layer, a second adhesive layer and a second protective layer that are stacked in sequence, and the first protective layer, the second protective layer, the first adhesive layer and the second adhesive layer have elasticity; and
the heat dissipation layer comprises a heat-conducting material, wherein the heat-conducting material is copper foil or graphite, and a surface of the heat dissipation layer comprises a non-planar region and a planar region, the heat-conducting material in the non-planar region has a corrugated structure that is compressible and stretchable when the film-like heat dissipation member is unfolded in a planar state, and lengths of planes of the film-like heat dissipation member change as the corrugated structure is compressed or stretched, the planes being perpendicular to a thickness direction of the film-like heat dissipation member.

9. The bendable display apparatus according to claim 8, wherein
a shape of a hinge zone of the corrugated structure in the non-planar region is any one or more of: an arc, a chevron, or a box.

10. The bendable display apparatus according to claim 9, wherein the corrugated structure comprises at least one hinge zone.

11. The bendable display apparatus according to claim 8, wherein a connection between the non-planar region and the planar region is a continuous connection.

12. The bendable display apparatus according to claim 8, wherein the non-planar region comprises one or more cut out regions.

13. A terminal device, comprising
a bendable display apparatus, including: a display panel, a bendable apparatus, and a film-like heat dissipation member located between the display panel and the bendable apparatus, wherein the bendable apparatus comprises two support members and a bending member, the display panel comprises a display region, and the display region comprises a first display region, a second display region, and a bending region between the first display region and the second display region; one of the two support members supports a first region, of the display panel, corresponding to the first display region; the other one of the two support members supports a second region, of the display panel, corresponding to the second display region; the bending member connects between the two support members to overlap the bending region, and guides the display panel to be bent or unfolded to be in a planar state relative to the bending region; and a surface of the film-like heat dissipation member is attached to a surface of the bendable apparatus;
wherein the film-like heat dissipation member comprises a first protective layer, a first adhesive layer, a heat dissipation layer, a second adhesive layer and a second protective layer that are stacked in sequence, and the first protective layer, the second protective layer, the first adhesive layer and the second adhesive layer have elasticity; and
the heat dissipation layer comprises a heat-conducting material, wherein the heat-conducting material is copper foil or graphite, a surface of the heat dissipation layer comprises a non-planar region and a planar region, the non-planar region comprises a corrugated structure that is compressible and stretchable when the film-like heat dissipation member is unfolded in a planar state, and lengths of planes of the film-like heat dissipation member change as the corrugated structure is compressed or stretched, the planes being perpendicular to a thickness direction of the film-like heat dissipation member.

14. The terminal device according to claim 13, wherein
a shape of a hinge zone of the corrugated structure in the non-planar region is in any one or more of: an arc, a chevron, or a box.

15. The terminal device according to claim 14, wherein the corrugated structure comprises at least one hinge zone.

16. The terminal device according to claim 13, wherein a connection between the non-planar region and the planar region is a continuous connection.

17. The terminal device according to claim 13, wherein the non-planar region comprises one or more cut out regions.

* * * * *

UNITED STATES PATENT AND TRADEMARK OFFICE
CERTIFICATE OF CORRECTION

PATENT NO. : 11,963,336 B2
APPLICATION NO. : 17/859034
DATED : April 16, 2024
INVENTOR(S) : Huipeng Wu et al.

Page 1 of 1

It is certified that error appears in the above-identified patent and that said Letters Patent is hereby corrected as shown below:

In the Claims

Column 12, Claim 1, Line 11, change "staked" to --stacked--.

Signed and Sealed this
Fourteenth Day of May, 2024

Katherine Kelly Vidal
*Director of the United States Patent and Trademark Office*